(12) United States Patent
Galasco et al.

(10) Patent No.: US 6,852,152 B2
(45) Date of Patent: Feb. 8, 2005

(54) COLLOIDAL SEED FORMULATION FOR PRINTED CIRCUIT BOARD METALLIZATION

(75) Inventors: Raymond T. Galasco, Vestal, NY (US); Roy H. Magnuson, Endicott, NY (US); Voya R. Markovich, Endwell, NY (US); Thomas R. Miller, Endwell, NY (US); Anita Sargent, Endicott, NY (US); William E. Wilson, Waverly, NY (US)

(73) Assignee: International Business Machines Corporation, Armonk, NY (US)

( * ) Notice: Subject to any disclaimer, the term of this patent is extended or adjusted under 35 U.S.C. 154(b) by 137 days.

(21) Appl. No.: 10/253,679

(22) Filed: Sep. 24, 2002

(65) Prior Publication Data

US 2004/0058071 A1 Mar. 25, 2004

(51) Int. Cl.$^7$ ............................................... C23C 18/30
(52) U.S. Cl. ...................................................... 106/1.11
(58) Field of Search ........................................ 106/1.11

(56) References Cited

U.S. PATENT DOCUMENTS

| | | | |
|---|---|---|---|
| 3,011,920 A | 12/1961 | Shipley, Jr. et al. | 106/1.11 |
| 3,515,649 A | 6/1970 | Hepfer | 205/164 |
| 3,562,038 A | 2/1971 | Shipley, Jr. et al. | 216/18 |
| 3,563,784 A | 2/1971 | Innes et al. | 427/306 |
| 3,573,973 A | 4/1971 | Drotar et al. | 427/98 |
| 3,684,572 A | 8/1972 | Taylor | 427/306 |
| 3,804,638 A * | 4/1974 | Jonker et al. | 106/1.26 |
| 3,844,799 A | 10/1974 | Underkofler, et al. | 106/1.26 |
| 3,877,981 A | 4/1975 | Arnold | 427/305 |
| 3,930,072 A | 12/1975 | Wilks | 427/306 |
| 4,008,343 A | 2/1977 | Cohen et al. | 427/305 |
| 4,152,467 A | 5/1979 | Alpaugh et al. | 427/8 |
| 4,301,190 A | 11/1981 | Feldstein | 427/97 |
| 4,448,804 A | 5/1984 | Amelio et al. | 427/98 |
| 4,478,883 A | 10/1984 | Bupp et al. | 427/97 |
| 4,554,182 A | 11/1985 | Bupp et al. | 427/304 |
| 4,790,912 A * | 12/1988 | Holtzman et al. | 427/97 |
| 4,891,069 A * | 1/1990 | Holtzman et al. | 106/1.15 |
| 5,250,105 A * | 10/1993 | Gomes et al. | 106/1.11 |
| 5,792,248 A | 8/1998 | Cane | 106/1.11 |
| 5,997,769 A | 12/1999 | Tittmann et al. | 252/403 |
| 6,022,670 A | 2/2000 | Russell et al. | 430/315 |
| 6,025,057 A | 2/2000 | Angelopoulos et al. | 428/209 |
| 6,136,513 A | 10/2000 | Angelopoulos et al. | 430/315 |
| 6,344,242 B1 | 2/2002 | Stolk et al. | 427/301 |
| 2002/0062760 A1 * | 5/2002 | Redline et al. | 106/1.11 |

OTHER PUBLICATIONS

McCutcheon's "Detergents & Emulsifiers 1972 Annual"; Feb. 12, 1972; pp. 50 and 188.*

* cited by examiner

Primary Examiner—Helene Klemanski
(74) Attorney, Agent, or Firm—Scully, Scott, Murphy & Presser; William H. Steinberg

(57) ABSTRACT

A colloidal metal seed formulation useful for catalytically activating a surface of a non-conductive dielectric substrate in an electroless plating process is provided. The colloidal metal seed formulation includes stannous chloride, palladium chloride, HCl and a surfactant selected from a diphenyloxide disulfonic acid or alkali or alkaline earth metal salt thereof, $C_{30}H_{50}O_{10}$, an alcohol alkoxylate and mixtures thereof. A method of electroless plating of a conductive metal onto a non-conductive dielectric substrate using the colloidal metal seed formulation is also provided.

14 Claims, No Drawings

COLLOIDAL SEED FORMULATION FOR PRINTED CIRCUIT BOARD METALLIZATION

FIELD OF THE INVENTION

The present invention relates to the fabrication of electronic packages such as chip carriers, printed circuit board cards, printed circuit cards, accessory cards, and the like. More specifically, the present invention relates to a colloidal metal seed formulation that includes an environmental friendly surfactant as a wetting agent and to a method of depositing a conductive metal layer onto a surface of a non-conductive dielectric substrate using the inventive colloidal metal seed formulation.

BACKGROUND OF THE INVENTION

Conventional printed circuit cards and circuit boards comprise a laminated non-conductive dielectric substrate that utilizes drilled and plated through-holes (i.e., PTHs) for communication between opposite sides and/or intermediate layers of the laminated substrate to wiring formed on both sides of the substrate. The plated through-holes are typically formed by applying a metal seed layer on the surface of a laminated non-conductive dielectric substrate prior to deposition of a metal such as copper. The seed layer is employed to 'catalyze' the surface of the laminated non-conductive dielectric substrate prior to metal deposition. The use of seed layers is necessary because the laminated substrate is comprised of non-conductive dielectric materials.

Among one of the more widely employed procedures for catalyzing the laminated non-conductive dielectric substrate is to treat the laminated substrate with a solution containing a stannous chloride sensitizer solution and a palladium chloride activator.

For instance, one method for catalyzing a dielectric substrate is exemplified by U.S. Pat. No. 3,011,920 to Shipley, Jr. which includes sensitizing the substrate by first treating the substrate with a solution of a colloidal metal, accelerating the treatment with a selective solvent to remove protective colloids from the sensitized dielectric substrate and then electrolessly depositing a metal coating on the sensitized substrate; for example, with copper from a solution of a copper salt and a reducing agent.

U.S. Pat. No. 4,008,343 to Cohen, et al. and U.S. Pat. No. 3,562,038 to Shipley, Jr., et al. also relate to methods for catalytically activating a surface of a non-conductive dielectric substrate with solutions containing Pd and Sn salts.

There have also been suggestions in the patent literature of treating substrates with certain surfactants. In particular, U.S. Pat. No. 4,301,190 to Feldstein suggests pretreatment of a substrate with an "adsorption modifier" to enhance the attachment to the substrate of a non-noble metal catalyst. Certain surfactants, hydride oxide sols and certain complexing agents are suggested as "adsorption modifiers". In particular, fluorocarbon surfactants and silicon-bearing surfactants are disclosed in Feldstein.

U.S. Pat. No. 3,563,784 to Innes, et al. suggests a method of pretreating non-conductors for plating including a step of treating the surface with certain monofunctional surfactants, rinsing, and then activating either by a two-step stannous chloride-palladium chloride treatment or a one-step acid, tin-palladium hydrosol treatment. The monofunctional surfactants disclosed in Innes, et al. include tallow trimethylammonium chloride, nonylphenoxypoly(ethyleneoxy) ethanol and acid phosphates.

U.S. Pat. No. 3,684,572 to Taylor relates to a method of plating non-conductors including steps of treating the surface of the non-conductors with certain quaternary amine monofunctional or single charged surfactants after etching and before catalyzing the surface.

U.S. Pat. No. 3,573,973 to Drotar, et al. relates to a process for plating a non-conductive substrate which includes a step of rinsing the substrate with certain detergents before sensitizing with stannous chloride and activating with palladium chloride.

U.S. Pat. No. 3,515,649 to Hepfer; U.S. Pat. No. 3,877,981 to Arnold; and U.S. Pat. No. 3,930,072 to Wilks are of interest in that the references disclose the use of surfactants in plating processes in steps prior to the deposition of a catalyst. Specifically, Hepfer discloses fluorocarbon surfactants; Arnold discloses low molecular weight alcohols such as propanol as the surfactant; and Wilks discloses alkylaryl polyether alcohols, sulfonates, sulfates or sorbitan derivatives as surfactants.

U.S. Pat. No. 3,421,922 to Wilson describes the application of a cationic film forming resin, specifically, melamine-formaldehyde resins, polyalkylene-amines, alkylated-methylol-melamines, triazine-formaldehyde and urea formaldehyde resins, onto surfaces of the substrate which are to be subsequently plated.

In co-assigned U.S. Pat. No. 4,478,883 to Bupp, et al., a method for conditioning surfaces of dielectric substrates for the electroless plating is disclosed in which a copolymer of a non-reactive backbone chain of polyacrylamide to which are attached short chains of a tetra-alkyl-ammonium compound, with multiple charge functionality dissolved in a diluted inorganic acid, such as hydrochloric acid, is applied to the substrate surface prior to activation.

Co-assigned U.S. Pat. No. 4,448,804 to Amelio, et al. provides a multistep process for the electroless plating of Cu onto a non-conductive surface. The seed bath includes palladium chloride, stannous chloride and HCl.

Co-assigned U.S. Pat. No. 4,554,182 to Bupp, et al. provides a method for the electroless plating of a metal such as copper onto non-conductive substrate surfaces.

This prior art method comprises bringing the surfaces of the substrate into contact with an aqueous composition containing $H_2SO_4$ and a multifunctional cationic copolymer containing at least two available cationic moieties and then activating the surfaces by treating them with a colloidal solution containing palladium chloride, stannous chloride and HCl.

In the '804 patent and the '182 patent mentioned above, the colloidal seed formulations disclosed therein contain a fluorocarbon surfactant such as perfluorooctane sulfonic acid (PFOS). The fluorocarbon surfactants are employed as wetting agents in such seed formulations. Initially, PFOS and other like fluorocarbon surfactants were chosen because of their highly stable structure, which helps in reducing the molecular breakdown of the surfactant in harsh chemical environments. However, it is for a similar reason that some perfluorinated compounds are being targeted for regulatory legislations. Recent EPA actions have dictated the use of PFOS and other like perfluorinated compounds be banned by the end of 2002 due to the bioaccumulative and toxicological properties of such compounds.

Consequently, because the nature of the seeding process for through-hole metallization requires good wetting ability to homogeneously catalyze plating in high-aspect ratio vias, an alternative surfactant is needed which is environmentally friendly. Moreover, a new surfactant for a colloidal seed formulation is needed, which does not negatively affect seed deposition, or require a significant amount of additional bath monitoring by personnel running the metallization process.

SUMMARY OF THE INVENTION

One object of the present invention is to provide a colloidal metal seed formulation that includes an environmental friendly surfactant as a replacement for conventional fluorocarbon surfactants.

Another object of the present invention is to provide a colloidal metal seed formulation that includes a surfactant that does not negatively affect the seed deposition process.

A further object of the present invention is to provide a colloidal metal seed formulation that includes a surfactant that has a higher charge density than that of a conventional fluorocarbon surfactant.

A yet further object of the present invention is to provide a colloidal metal seed formulation that includes a surfactant that has a high solubility in a wide variety of electrolytes.

A still further object of the present invention is to provide a colloidal metal seed formulation that includes a surfactant that is not deactivated by monovalent or divalent ions which could cause precipitation of the colloidal metal and render the seed ineffective.

An even further object of the present invention is to provide a colloidal metal seed formulation that includes a surfactant that maintains the required low surface tension (e.g., $\leq 50$, preferably 32–36, dynes/cm$^2$) over the life of the colloidal metal seed bath with little or no replenishment of surfactant.

These and other objects and advantages are achieved in the present invention by providing a colloidal metal seed formulation that comprises a surfactant selected from a diphenyloxide disulfonic acid or an alkali or alkaline earth metal salt thereof, $C_{30}H_{50}O_{10}$, an alcohol alkoxylate and mixtures thereof. Preferably, the surfactant employed in the colloidal metal seed formulation is a diphenyloxide disulfonic acid based surfactant including the alkali and alkaline earth metal salts thereof.

The diphenyloxide disulfonic acids employed in the present invention are compounds having the formula:

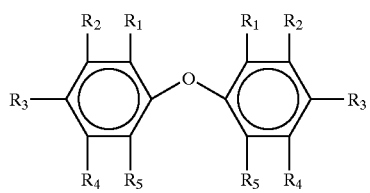

wherein at least one of $R_1$, $R_2$, $R_3$ and $R_4$ on each phenyl ring is $SO_3$ and the remaining R groups on each phenyl ring, independently, are hydrogen, a linear or branched alkyl containing from 1 to about 22 C atoms, a linear or branched alkylene containing from 2 to about 22 C atoms, an alkynyl containing 2 to 22 C atoms, hydroxy, or alkoxy containing from 1 to 22 carbon atoms, or two adjacent remaining R groups taken together form an alicyclic ring containing from 5 to 6 carbon atoms which may optionally include a heteroatom such as N, S or P. When alkali metal salts are employed, an alkali metal such as Na, K, Li, Rb, Cs, or Fr, preferably Na, K or Li, most preferably Na, is associated with the above diphenyloxide disulfonic acid compound such that the net charge of the molecule is zero. When alkaline earth metal salts are employed, an alkaline earth metal such as Mg, Ca, Sr, Ba or Ra is associated with the above diphenyloxide disulfonic acid compound such that the net charge of the molecule is zero.

The alcohol alkoxylates that can be employed in the present invention typically have the formula R—O—$(CH_2CH_2O)_n(CH_2CHCH_3O)_nCH_2CH_2OH$ wherein R is hydrogen, a linear or branched alkyl containing from 1 to about 22 C atoms, a linear or branched alkylene containing from 2 to about 22 C atoms or an alkynyl containing 2 to 22 C atoms; and n is a number from 1 to 50.

The surfactants described above may be used alone or in conjunction with other ingredients including, for example, sodium chloride, acids, and water.

The use of diphenyloxide disulfonic acid based surfactants including the alkali or alkaline earth metal salt derivatives are highly preferred in the present invention since such surfactants possess several advantageous qualities including: (1) the diphenyloxide disulfonic acid based surfactants have double the charge density of the conventional PFOS surfactant, thereby allowing them to display improved solvating and coupling action in highly ionic electrolytes such as the colloidal seed; (2) the diphenyloxide disulfonic acid based surfactants have a flexible ether linkage which broadens their solubility in a wide variety of electrolytes; (3) unlike other surfactants considered as replacements, the diphenyloxide disulfonic acid based surfactants are not deactivated by monovalent or divalent ions which cause precipitation of colloidal particles and rends the seed ineffective; and (4) diphenyloxide disulfonic acid based surfactants have proven in repeated testing performed by the applicants to maintain the required low surface tension (i.e., $\leq 50$ dynes/cm$^2$) over the life of the seed bath (of approximately 30 days or greater) with no or little replenishment of surfactant.

The inventive colloidal metal seed formulation comprises stannous chloride, palladium chloride, HCl and a surfactant selected from a diphenyloxide disulfonic acid or alkali or alkaline earth metal salt thereof, $C_{30}H_{50}O_{10}$, an alcohol alkoxylate and mixtures thereof. Preferably, the surfactant employed in the colloidal metal seed formulation is a diphenyloxide disulfonic acid based surfactant.

Another aspect of the present invention relates to a method of electroless plating a conductive metal onto a surface of a non-conductive dielectric substrate using the inventive colloidal metal seed solution described above. Specifically, the method of the present invention comprises the steps of:

laminating a roughened metal sheet to at least one surface of a non-conductive dielectric substrate; etching away all of the roughened metal sheet;

contacting the etched surface with an acidic solution containing at least two available ionic moieties to provide a conditioned surface;

contacting the conditioned surface with a colloidal metal seed formulation so as to provide an activated surface, said colloidal metal seed formulation comprising stannous chloride, palladium chloride, HCl and a surfactant selected from a diphenyloxide disulfonic acid or an alkali or alkaline earth metal salt thereof, $C_{30}H_{50}O_{10}$, an alcohol alkoxylate and mixtures thereof; and plating a conductive metal onto said activated surface.

In some embodiments of the present invention, the activated surface is subjected to various pretreatment steps prior to plating. In one preferred embodiment, the further pretreatment includes the steps of: rinsing the activated surface with deionized water; bringing the rinsed surface into contact with HCl; drying the substrate at a temperature between 60° C. and 100° C.; applying a photoresist layer to the cleaned, activated surface; exposing the photoresist layer to a pattern of radiation; and developing the photoresist layer using a conventional resist developer.

It is noted that in the inventive method described above, the substrate may contain small vias or plated through-holes which have a diameter on the order of about 100 μm or less. Specifically, the inventive seed formulation allows wetting of these small vias whereas seeders without the surfactant disclosed herein cannot wet and subsequently leads to unplated vias.

DETAILED DESCRIPTION OF THE INVENTION

The present invention which provides a novel colloidal metal seed formulation useful for the electroless plating of a conductive metal onto a surface of a non-conductive dielectric substrate will now be described in greater detail.

As stated above, the inventive method is applicable to the electroless plating of a conductive metal such as copper (Cu), tungsten (W), nickel (Ni), cobalt (Co), cobalt tungsten (CoW), cobalt tungsten phosphorus (CoWP) and the like onto a wide variety of non-conductive dielectric substrates including especially thermoplastic and thermosetting resins as well as glass. Note that the conductive metals employed in the present invention are catalytically deposited by palladium. In a highly preferred embodiment of the present invention, the conductive metal employed is Cu.

Typical thermosetting resins that may be employed in the present invention include, but are not limited to: epoxy, phenolic base materials, and polyamines. The dielectric substrates may be molded articles of the polymers containing fillers and/or reinforcing agents such as glass filled epoxy or phenolic-based materials. Examples of suitable thermoplastic materials which may be employed in the present invention include, but are not limited to: polyolefins such as polypropylene; polysulfones; polycarbonates; nitrile rubbers; and ABS polymers.

The term "surface" as used throughout the present application refers to the surfaces inside through-holes as well as to major surfaces of the non-conductive dielectric substrate. For instance, the present invention is useful for seeding the plated throughhole where the circuitry is being applied by either additive metal plating upon a thin layer of peel-apart conductive metal or by a subtractive process. Also, the present invention is useful for seeding in an electroless direct bond (EDB) process. In this application, the circuitry is additively plated both in the through-holes and on the areas of the surface exposed in the opening of a photoresist mask selectively applied to the substrate surface.

Prior to initiation of the inventive method, through-holes, which are employed to receive the vias connecting different levels of circuitry, are formed, if required, and the non-conductive dielectric substrate with the through-holes is suitably cleaned and precondition. The preconditioned step can include the creation of active sites by physical means such as sand and/or vapor blasting and/or chemical methods such as solvent swelling. A typical solvent that can be used at this point of the present invention is N-methyl-pyrrolidone. The non-conductive dielectric substrate can also be pretreated with a permanganate composition.

If the inventive method is applied in a process for selectively electroless plating a conductive metal, such as copper, onto the substrate surface, the following steps for preconditioning the surface are preferably employed in the present invention.

Onto the surface of the dielectric substrate a metal sheet, preferably Cu, having a roughened surface is laminated by pressing the roughened surface of the metal sheet against the surface of the non-conductive dielectric substrate. The metal sheet may have any desired thickness such as, for example, a thickness of about 25.4 μm. Subsequently, the metal sheet is completely etched off using an etchant that is highly selective in removing the metal sheet. Apparently at this stage of the present invention, anchor points for the conductive metal to be subsequently plated thereon have developed at the surface of the substrate. These anchor points facilitate the plating of the metal afterwards and improve its adhesion to the surface of the non-conductive dielectric substrate.

If through-connections are required in the substrate (e.g., if printed circuits on both sides of a flat substrate have to be connected), through-holes are now drilled through the substrate, preferably by a laser beam or by mechanical drilling. Subsequently the through-holes are cleaned either by vapor blasting or chemical methods, such as solvent swelling. It is also possible to produce the through-holes prior to the removing of the metal sheet.

The next step is a cleaning step, where the substrate is preferably cleaned for about five minutes at a temperature of between 45° C. and 60° C. with an alkaline cleaner consisting of a solution containing sodium phosphate and sodium silicate and having a pH value of 13. The cleaner is rinsed off with deionized water having a temperature of between 45° C. and 60° C.

In accordance with the present invention, the non-conductive substrate is now treated with an aqueous solution containing an acid, such as $H_2SO_4$, and a multifunctional cationic copolymer. The copolymer is a multifunctional cationic material in that it contains at least two active or available cationic functional moieties. The preferred ionic moieties are quaternary phosphonium and quaternary ammonium groups. Copolymers containing at least two cationic moieties are commercially available and need to be described herein in detail. Examples of commercially available multifunctional cationic copolymers are Reten 210® and Reten 220®, available from HERCULES; a description of which can be found in "Water-Soluble Polymers", Bulletin VC-482A, HERCULES Inc., Wilmington, Del. 1989, the disclosure of which is incorporated herein by reference.

Reten 210® is in powder form and is a copolymer of acrylamide and betamethacryloxyethyltrimethylammonium methyl sulfate, having a Brookfield viscosity in a 1% solution of 600–1000 cps. Reten 220® is in powder form and is a copolymer of acrylamide and betamethacryloxyethyltrimethylammonium methyl sulfate, having a Brookfield viscosity in a 1% solution of 800–1200 cps.

The molecular weight of the Reten® polymers are usually relatively high and vary from about 50,000 to about 1,000,000 or more. These high molecular weight polymers are solid products and their main chemical backbone structure is polyacrylamide. To the polyacrylamide, various tetra alkyl ammonium compounds can be attached. These quaternary ammonium groups provide the number of positive charges of the polymer.

The cationic copolymer is employed as a dilute aqueous solution of about 0.01% to about 1% by weight and preferably about 0.05% to about 0.5% by weight of the copolymer. The aqueous solution also contains an acid such as sulfuric acid to provide a pH value of usually about 0 to about 2 and preferably about 1. Low pH values are preferred in order to obtain a relatively low viscosity for the polymer solution to facilitate application of the polymer. The acid is usually present in amounts of about 2% to about 4% by weight, 2% by weight being preferred.

The treatment with the cationic copolymer requires generally about one minute to about ten minutes and preferably about one minute to about two minutes. The multifunctional cationic copolymer provides a surface of a positive polarity while the catalyst particles to be subsequently applied to the substrate have a negative polarity. This difference in polarity provides for electrostatic attraction of the catalyst particles.

After the substrate is contacted with the cationic copolymer composition, the substrate is rinsed to remove any excess copolymer not adsorbed by the substrate surface.

Next the substrate surface and/or through-hole surface is activated by means of a colloidal solution containing palladium chloride, stannous chloride and hydrochloric acid. The activation serves to initiate the electroless plating process. The surfaces are brought into contact with the colloidal solution preferably for five minutes, however the contact time can vary between one minute and ten minutes. To produce the seeder bath two solutions (A and B) are prepared. About 60 kg of $SnCl_2.2H_2O$ are dissolved in 20 liters of concentrated (37%) HCl with stirring. It is very important to dissolve the $SnCl_2.2H_2O$ in concentrated HCl. Under these conditions no hydrolysis of the Sn-salt takes place. When the salt is totally dissolved, more 37% HCl is added until a volume of 50 liters is reached (solution A). About 1 kg of $PdCl_2$ is dissolved in 15 liters of 37% HCl. This solution is diluted with deionized water until a volume of 50 liters is reached (solution B). Solution B is added slowly to solution A with stirring. The mixture is boiled for two hours. After cooling, a surfactant selected from a diphenyloxide disulfonic acid or alkali or alkaline earth metal salt thereof, $C_{30}H_{50}O_{10}$, an alcohol alkoxylate and mixtures thereof is added to the mixture. Preferably, the surfactant employed is a diphenyloxide disulfonic acid based surfactant. Note that the surfactant can be added directly to the cooled mixture, after the master seed bath has been prepared and stored for a period of time, or after dilution with NaCl.

The term 'diphenyloxide disulfonic acid' denotes a compound having the formula:

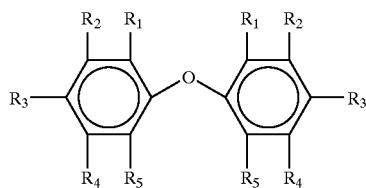

wherein at least one of $R_1$, $R_2$, $R_3$ and $R_4$ on each phenyl ring is $SO_3$ and the remaining R groups on each phenyl ring, independently, are hydrogen, a linear or branched alkyl containing from 1 to about 22 C atoms, a linear or branched alkylene containing from 2 to about 22 C atoms, an alkynyl containing 2 to 22 C atoms, hydroxy, or alkoxy containing from 1 to 22 carbon atoms, or two adjacent remaining R groups taken together to form an alicyclic ring containing from 5 to 6 carbon atoms which may optionally include a heteroatom such as N, S or P.

When alkali metal salts are employed, an alkali metal such as Na, K, Li, Rb, Cs, or Fr, preferably Na, K or Li, most preferably Na, is associated with the above diphenyloxide disulfonic acid compound such that the net charge of the molecule is zero. When alkaline earth metal salts are employed, an alkaline earth metal such as Mg, Ca, Sr, Ba or Ra is associated with the above diphenyloxide disulfonic acid compound such that the net charge of the molecule is zero.

Illustrative examples of preferred diphenyloxide disulfonic acids include: DOWFAX 8390®, DOWFAX C10L®, DOWFAX 3B2®, DOWFAX 3B0®, DOWFAX 2A0® (70%) and DOWFAX 2A1®.

DOWFAX 8390® is a mixture that includes disodium hexadecyldiphenyloxide disulfonate, disodium dihexadecyldiphenyloxide disulfonate, sodium sulfate, sodium chloride and water. DOWFAX C10L® is a mixture that includes decyl(sulfophenoxy) benzenesulfonic acid, disodium oxybis (decylbenzenesulfonic acid), disodium salt, sodium sulfate, sodium chloride and water. DOWFAX C6L® is a mixture which includes benzene, 1,1'-oxybis, sec-hexyl derivatives, sulfonated sodium salts, sodium sulfate, sodium chloride and water. DOWFAX 3B2® is a mixture which includes decyl(sulfophenoxy) benzenesulfonic acid, disodium salt oxybis(decylbenzenesulfonic acid), disodium salt, sodium sulfate, sodium chloride, and water. DOWFAX 3B0® is a mixture of decyl(sulfophenoxy)benzenesulfonic acid, decyl (decylsulfophenoxy) benzenesulfonic acid, sulfuric acid and water. DOWFAX 2A1® is a mixture of benzene, 1-1-oxybis, tetrapropylene derivates, sulfonated sodium salts, sodium sulfate, sodium chloride and water.

The surfactant $C_{30}H_{50}O_{10}$ is sold under the tradename TRITON DF-16®.

The alcohol alkoxylates that can be employed in the present invention typically have the formula $R—O—(CH_2CH_2O)_n(CH_2CHCH_3O)_nCH_2CH_2OH$ wherein R is hydrogen, a linear or branched alkyl containing from 1 to about 22 C atoms, a linear or branched alkylene containing from 2 to about 22 C atoms or an alkynyl containing 2 to 22 C atoms, and n is from 1 to 50. A preferred alcohol alkoxylate that is employed in the present invention is TRITON XL-80N®.

The above surfactants are typically present in the seed bath in an amount of from about 0.001 to about 5%, based on v/v. In a highly preferred embodiment, the surfactants are present in an amount of from about 0.1 to about 0.2%, v/v.

This solution can be stored for several months. To prepare the actual seeder bath about 130 ml of this solution and about 175 grs of NaCl are taken to a volume of one liter by adding deionized water. This seeder bath contains per liter solution about 80 grs of $SnCl_2.2H_2O$, about 1.2 grs $PdCl_2$, about 85 ml of 37% HCl, about 0.09 g of one of the above mentioned surfactants and the NaCl. In order to replenish the seeder bath after it is used for some time, fresh solution can be added. It was found that the seeder bath works satisfactorily if the amount of $SnCl_2.2H_2O$ varies between 80 grs and 150 grs, of $PdCl_2$ between 1.2 grs and 2.6 grs and of HCl between 85 ml and 300 ml per liter of solution.

The colloidal metal seed bath contains colloidal particles having a nucleus of palladium and tin in the weight ratio of 1:3 and a shell of chloride ions.

The surfaces are brought into contact with the colloidal solution at room temperature for five minutes, however the contact time can vary between one minute and ten minutes.

The colloidal particles, having a shell of negative chloride ions, adhere by means of electrostatic attraction to the dielectric surface having positive charges due to the treatment with Reten® polymers.

Onto the conditioned surfaces a metal, such as nickel or copper, is plated without further treatment prior to the plating except for air-drying. The conditioned surfaces may be washed with deionized water, treated with diluted HCl and dried at elevated temperatures prior to the plating. In addition to these process steps, photoresist masks corresponding to the negative of desired metal patterns may be formed on the activated surfaces prior to the plating. The washing, HCl treatment and drying step sequence is especially important if a photoresist mask is applied prior to plating.

Plating without further preceding treatments is particularly applicable, if the conditioned surfaces are restricted to the through-holes. Metals such as nickel or copper are plated by electroless plating onto the treated surface until the desired thickness is reached. The preferred metal employed is copper. The preferred copper electroless plating bath and the method of application are disclosed in co-assigned U.S. Pat. Nos. 3,844,799 to Underkopfler, et al. and U.S. Pat. No. 4,152,467 to Alpaugh, et al., the entire contents of each are incorporated herein by reference.

The copper electroless plating bath is generally an aqueous composition which includes a source of cupric ion, a reducing agent, a complexing agent for the cupric ion and a pH adjuster. The plating bath also preferably includes a cyanide ion source and a surface-active agent.

The cupric ion source generally used is a cupric sulfate. It is preferred to use 10 grams/liter and most preferably from about 8 grams/liter to about 12 grams/liter. The most common reducing agent employed is formaldehyde which is preferably used in amounts from about 0.7 grams/liter to about 7 grams/liter and most preferably from about 0.7 grams/liter to about 2.2 grams/liter. The most common complexing agent is ethylene diamine tetraacetic acid (EDTA). The amount of complexing agent is dependent upon the amount of cupric ions present in the solution and is generally from about 20 grams/liter to about 50 grams/liter, or in a 3–4 fold molar excess. The plating bath can also contain a surfactant which assists in wetting the surface to be coated. A satisfactory surfactant is, for instance, an organic phosphate ester available under the trade designation Gafac RE-610®. Generally the surfactant is present in amounts from about 0.02 grams/liter to about 0.3 grams/liter.

In addition, the pH of the bath is also generally controlled, for instance, by the addition of a basic compound such as sodium hydroxide or potassium hydroxide in the desired amount to achieve the desired pH. The preferred pH of the electroless plating bath is between 11.6 and 11.18. Also preferably, the plating bath contains a cyanide ion in the form of sodium cyanide or ammonium cyanide. The amount is preferably between about 10 mg/liter and about 25 mg/liter to provide a cyanide ion concentration in the bath within the range of 0.0002 molar to 0.0004 molar. The temperature of the bath is preferably maintained between 70° C. and 80° C. and most preferably between 70° C. and 75° C. Also, it is preferred to maintain the $O_2$ content of the bath between about 2 ppm and about 4 ppm and preferably between about 2.5 ppm and about 3.5 ppm. The $O_2$ content can be controlled by injecting oxygen and an inert gas into the bath.

The treatment enumerated above prior to the plating are useful in those cases where metal is plated continuously or selectively onto the major surfaces of the substrates.

The enumerated process steps are described herein below in more detail: The substrates are rinsed with deionized water. Due to the sudden change of the pH value, most of the chloride ions are replaced are replaced by OH— ions. Subsequently the substrates are treated with 8% HCl, where tin is selectively removed from the substrate surface. This leaves enriched Pd regions with an increased catalytic effect in the plating process. (The amount of Sn is less than 1 $\mu gr/cm^2$ by the HCl treatment whereas the amount of Pd is of the order of 3–4 $\mu grs/cm^2$).

After another rinse with deionized water, the substrates are dried in an oven for 30 minutes at a temperature between about 60° C. and about 70° C. or in a vacuum oven at about 100° C. In the drying operation all the water is driven off irreversibly from the colloidal particles leaving a shell of oxygen in the form of insoluble tin oxide.

If it is intended to produce a blanket metal coating on the substrate surface, the next step is the electroless plating as described above. If the metal is to be applied in an additive process, onto the dried substrate surface a photoresist layer is applied, either by spin-coating or, preferably, by laminating a nonaqueous photoresist foil onto the substrate surface. Such a foil is a negative photoresist and is marketed by DuPont under the type designation T-168®.

By exposure through an appropriate mask exactly aligned to the substrate and subsequent developing, the negative of the desired circuit pattern is produced of the photoresist foil. In the areas corresponding to the desired pattern where the photoresist has been removed in the development step, the catalyzed regions of the substrate surface are exposed. The photoresist process has no detrimental effect on the catalyzed surfaces including the surfaces in the through-holes. No resist blistering is determined in the areas corresponding to the desired pattern.

Next the metal is plated by electroless plating onto the exposed surface areas. The plating process is described herein below with copper as the metal. However, the process is transferable to other metals as well. The plating is done in two steps differing in the composition of the baths used and in the duration of the steps.

Both baths contain in one liter of solution about 8 grams to about 10 grams copper sulfate, about 35 grams to about 5 grams ethylene diamine tetraacetic acid (EDTA), about 2 ml to about 3 ml formaldehyde and 0.02 grams to about 0.03 grams of a surfactant. The surfactant assists in wetting the surfaces to be coated. A satisfactory surfactant is, for example, an organic phosphate ester available under the trade designation GaFac RE-610®. The preferred pH value of the electroless plating bath is between 11.6 and 11.8 at a temperature of 25° C. The bath used in the first plating step contains no cyanide which permits an oxygen level below 2 ppm. No gas, like air, is bubbled through the bath.

CN and $O_2$ form soluble complex ions with Pd. The lower limit of the $O_2$ content can be controlled by injecting oxygen and an inert gas into the bath. The bath used in the second plating step contains about 10 ppm to about 20 ppm cyanide and its oxygen content is about 3 ppm, which is achieved by bubbling air through the bath. It is not necessary to remove the substrates from the first bath and put it in the second. It is also possible to transform the first bath into the second by adding sodium cyanide and bubbling air through the bath after the first plating period.

The plating takes place at a temperature between 70° C. and 75° C. where the substrate is plated in the first step from about 15 minutes to about 30 minutes and in the second plating step from about 10 hours to about 20 hours. The plated copper is between about 37.5 and 50 $\mu m$ thick.

With the inventive method a homogenous coverage of all the substrate surface areas exposed including the through-holes is achieved. The thickness of the plated copper is essentially homogenous and its adhesion to the substrate is excellent. After the plating the photoresist is stripped, preferably with a suitable solvent such as benzyl alcohol, propylene carbonate, methylene chloride or similar solvents, and the Pd in the areas not plated with copper is removed by a treatment with a chlorite solution.

The inventive method is applicable especially in processes for producing metal circuit on substrates such as thermosetting and thermoplastic resins and of glass. The method is especially useful for producing high quality copper plated epoxy boards and cards.

The inventive method is also very advantageously applied in processes for reworking substrates that have already undergone electroless plating and eventually soldering, are structurally sound, but have then been rejected due to defects, such as opens or plating voids, solder defects and scratches on the circuitry. The substrates to be reworked are selectively covered with a metal, such as copper, and sometimes also selectively with photoresist and/or tin.

In the first step of the reprocessing the photoresist is stripped, preferably with methylene chloride or similar organic solvents, and subsequently the substrates are dried. Then the metal is applied by plating and, if present, the tin is first removed by etching. If the metal is copper, preferably a $CuCl_2$/HCl solution is used, since this agent etches copper and also tin. At this stage the surface of the substrates apparently exhibit the roughness that is produced in the method described above by laminating a copper sheet with a roughened surface to the substrate surface to be plated and subsequently etching off the copper sheet. From this point on the reprocessing proceeds as described above (e.g., with the process steps of rinsing with an alkaline solution, conditioning the surface with a Reten® solution, seeding the surface with palladium/tin salts in a single seed process, rinsing with deionized water, accelerating by removing most of the tin with a 8%-HCl-solution, forming a photoresist mask corresponding to the negative of the desired circuit pattern, selective electroless metal plating, and finally photoresist stripping).

As stated above, the aforementioned surfactants employed in the seed bath are environmental friendly surfactants which are employed as replacements for conventional fluorocarbon surfactants. The surfactants of the present invention do not negatively affect the seed deposition process and they typically have a higher charge density than that of conventional fluorocarbon surfactants. Another advantage of the surfactants employed in the present invention is that they have a high solubility in a wide variety of electrolytes, and the surfactants are not deactivated by monovalent or divalent ions which could cause precipitation of the colloidal metal and render the seed ineffective.

An even further advantage of the present invention is that the surfactants mentioned above in connection with the seed bath maintain the required low surface tension (e.g., $\leq 50$, preferably 32–36, dynes/cm$^2$) over the life of the colloidal metal seed bath with little or no replenishment of surfactant.

The following example is provided to illustrate the applicability of the inventive colloidal metal seed formulation as well as some advantages that can be achieved using the same in an electroless Cu plating process.

EXAMPLE

Test samples consisting of 160 mil thick, copper clad composites with 14 mil drilled through-holes were seeded using the baths mentioned in TABLE 2. The seed process for composite through-hole plating generally consisted of the sequence of steps mentioned in TABLE 1:

TABLE 1

| STEP | TEMPERATURE (° F.) | TIME (MINUTES) |
|---|---|---|
| 1. Alkaline Cleaner | 140–160 | 4–6 |
| 2. Deionized (DI) water rinse | 140–160 | 2–3 |
| 3. RETEN ® (adhesion promoter) | Ambient | 1–5 |
| 4. DI water rinse | Ambient | 2–3 |
| 5. Microetch | Ambient | 1–5 |
| 6. DI water rinse | Ambient | 1–2 |
| 7. 5–10% HCl | Ambient | 1–2 |
| 8. Palladium Seeder | Ambient | 2–5 |
| 9. DI water rinse | Ambient | 2–3 |
| 10 NaOH or HCl activator | Ambient | 1–5 |

The test matrix included the following procedures:
(1) Seed with surfactant mentioned below according to recommended process; (2) seed with surfactant mentioned below according to recommended process with elimination of RETEN® step to intentionally cause some voiding; and (3) seed with surfactant mentioned below according to recommended process, with dwell time in seed increased by an additional minute. After seed, the pieces were rinsed and baked as described above. The test samples were flash plated with the aforementioned electroless Cu chemistry for 30 minutes to provide a thin layer of copper over all the conducting and non-conducting surfaces. Test samples were cross-sectioned and the entire plated through-hole back wall was examined. TABLE 2 that follows shows the seed baths employed as well as the results obtained using the same.

TABLE 2

| Sample | Conditions | Plating Results |
|---|---|---|
| 1: Invention | Seed w/DOWFAX 8390 ® | good |
| 2: Comparative Example | Seed w/DOWFAX 8390 ®; Eliminate Reten ® step | 100% voided |
| 3: Invention | Seed w/DOWFAX 8390 ®; additional minute in seed | good |
| 4: Invention | Seed w/DOWFAX C10L ® | good |
| 5: Comparative Example | Seed w/DOWFAX C10L ®; without Reten ® step | 50% voided; 50% plated |
| 6: Invention | Seed w/DOWFAX C10L ®; additional minute in seed | good |
| 7: Prior art | Seed w/ a fluorocarbon surfactant | Good |
| 8: Prior art | Seed w/ a fluorocarbon surfactant; without Reten ® step | 100% voided |
| 9: Prior art | Seed w/ a fluorocarbon surfactant; additional minute in seed | good |

Examination of the plated through-hole walls after seed and plate suggested that the resulting seed deposition and coverage of seed from formulations containing the inventive seed surfactants was equal to or better than the currently used fluorocarbon surfactant. Elimination of the RETEN® step caused voiding in all cells. Increasing the seed dwell time by one minute did not visually appear to improve the seed deposition quality. Therefore, since it has been previously been illustrated that the surfactants employed in the present invention remain stable in the seed formulation over the entire lifetime, the disclosed improved seed formulation represents a more environmentally friendly alternative to the PFOS containing seed.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A colloidal metal seed formulation consisting essentially of stannous chloride, palladium chloride, HCl and a surfactant comprising at least one of a diphenyloxide disulfonic acid or alkali or alkaline earth metal salt thereof, a polyethoxylated alcohol, or an alcohol alkoxylate.

2. The colloidal metal seed formulation of claim 1 wherein said surfactant is a diphenyloxide disulfonic acid or an alkali metal salt thereof.

3. The colloidal metal seed formulation of claim 2 wherein said diphenyloxide disulfonic acid is a compound having the formula:

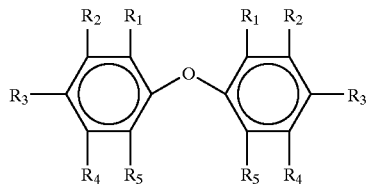

wherein at least one of $R_1$, $R_2$, $R_3$ and $R_4$ on each phenyl ring is $SO_3$ and the remaining R groups on each phenyl ring, independently, are hydrogen, a linear or branched alkyl containing from 1 to about 22 C atoms, a linear or branched alkylene containing from 2 to about 22 C atoms, an alkynyl containing 2 to 22 C atoms, hydroxy, or alkoxy containing from 1 to 22 carbon atoms, or two adjacent remaining R groups taken together form an alicyclic ring containing from 5 to 6 carbon atoms which may optionally include a heteroatom such as N, S or P.

4. The colloidal metal seed formulation of claim 2 wherein said alkali metal salt of said diphenyloxide disulfonic acids includes an alkali metal which provides a net zero charge to the compound.

5. The colloidal metal seed formulation of claim 1 wherein said surfactant is a polyethoxylated alcohol having the formula $C_{30}H_{50}O_{10}$.

6. The colloidal metal seed formulation of claim 1 wherein said surfactant is an alcohol alkoxylate.

7. The colloidal metal seed formulation of claim 6 wherein said alcohol alkoxylate has the formula R—O—(CH$_2$CH$_2$O)$_n$(CH$_2$CHCH$_3$O)$_n$CH$_2$CH$_2$OH wherein R is hydrogen, a linear or branched alkyl containing from 1 to about 22 C atoms, a linear or branched alkylene containing from 2 to about 22 C atoms or an alkynyl containing 2 to 22 C atoms, and n is from 1 to 50.

8. The colloidal metal seed formulation of claim 1 wherein said surfactant is present in an amount of from about 0.001 to about 5% v/v.

9. The colloidal metal seed formulation of claim 1 wherein said surfactant maintains a low surface tension of less than or equal to 50 dynes/cm$^2$ over the formulation's lifetime.

10. A colloidal metal seed formulation comprising colloidal metal particles consisting essentially of a nucleus of palladium and tin and a shell of chloride ions and a surfactant comprising at least one of a diphenyloxide disulfonic acid or an alkali or alkaline metal salt thereof, a polyethoxylated alcohol, or an alcohol alkoxylate.

11. A colloidal metal seed formulation comprising stannous chloride, palladium chloride, HCl and a surfactant comprising at least one of $C_{30}H_{50}O_{10}$ or an alcohol alkoxylate having the formula:

R—O—(CH$_2$CH$_2$O)$_n$(CH$_2$CHCH$_3$O)$_n$CH$_2$CH$_2$OH wherein R is hydrogen, a linear or branched alkyl containing from 1 to about 22 C atoms or an alkynyl containing 2 to 22 carbon atoms, and n is from 1 to 50.

12. The colloidal metal seed formulation of claim 11 wherein said surfactant is present in an amount of from about 0.001 to about 5% v/v.

13. The colloidal metal seed formulation of claim 11 wherein said surfactant maintains a low surface tension of less than or equal to 50 dynes/cm$^2$ over the formulation's lifetime.

14. A colloidal metal seed formulation comprising colloidal metal particles of palladium and tin and a surfactant comprising at least one of $C_{30}H_{50}O_{10}$ or an alcohol alkoxylate having the formula:

R—O—(CH$_2$CH$_2$O)$_n$(CH$_2$CHCH$_3$O)$_n$CH$_2$CH$_2$OH wherein R is hydrogen, a linear or branched alkyl containing from 1 to about 22 C atoms or an alkynyl containing 2 to 22 carbon atoms, and n is from 1 to 50.

* * * * *